United States Patent
Ching et al.

(10) Patent No.: US 9,847,425 B2
(45) Date of Patent: Dec. 19, 2017

(54) FINFET WITH A SEMICONDUCTOR STRIP AS A BASE

(71) Applicant: Taiwan Semiconductor Manufacturing Company, Ltd., Hsin-Chu (TW)

(72) Inventors: Kuo-Cheng Ching, Zhubei (TW); Shi Ning Ju, Hsin-Chu (TW); Ching-Wei Tsai, Hsin-Chu (TW); Chih-Hao Wang, Baoshan Township (TW); Ying-Keung Leung, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/203,866

(22) Filed: Jul. 7, 2016

(65) Prior Publication Data
US 2017/0278970 A1    Sep. 28, 2017

Related U.S. Application Data

(60) Provisional application No. 62/312,763, filed on Mar. 24, 2016.

(51) Int. Cl.
*H01L 29/06* (2006.01)
*H01L 29/78* (2006.01)
(Continued)

(52) U.S. Cl.
CPC ...... *H01L 29/7851* (2013.01); *H01L 29/0653* (2013.01); *H01L 29/0847* (2013.01);
(Continued)

(58) Field of Classification Search
CPC . H01L 29/7851; H01L 29/24; H01L 29/0847; H01L 29/161; H01L 29/165;
(Continued)

(56) References Cited

U.S. PATENT DOCUMENTS 6,458,671 B1 * 10/2002 Liu .................. H01L 27/10861
257/E21.549
8,487,378 B2    7/2013 Goto et al.
(Continued)

*Primary Examiner* — Cuong B Nguyen
(74) *Attorney, Agent, or Firm* — Slater Matsil, LLP

(57) ABSTRACT

A method includes forming a first hard mask over a semiconductor substrate, etching the semiconductor substrate to form recesses, with a semiconductor strip located between two neighboring ones of the recesses, forming a second hard mask on sidewalls of the semiconductor strip, performing a first anisotropic etch on the second hard mask to remove horizontal portions of the second hard mask, and performing a second anisotropic etch on the semiconductor substrate using the first hard mask and vertical portions of the second hard mask as an etching mask to extend the recesses down. The method further includes removing the vertical portions of the second hard mask, and forming isolation regions in the recesses. The isolation regions are recessed, and a portion of the semiconductor strip between the isolation regions protrudes higher than the isolation regions to form a semiconductor fin.

20 Claims, 18 Drawing Sheets

(51) Int. Cl.
*H01L 29/08* (2006.01)
*H01L 29/161* (2006.01)
*H01L 29/165* (2006.01)
*H01L 29/24* (2006.01)
*H01L 29/267* (2006.01)
*H01L 29/66* (2006.01)

(52) U.S. Cl.
CPC .......... *H01L 29/161* (2013.01); *H01L 29/165* (2013.01); *H01L 29/24* (2013.01); *H01L 29/267* (2013.01); *H01L 29/66545* (2013.01); *H01L 29/66636* (2013.01); *H01L 29/66795* (2013.01); *H01L 29/7848* (2013.01)

(58) Field of Classification Search
CPC ............... H01L 29/7848; H01L 29/267; H01L 29/0653; H01L 29/66795; H01L 29/66636; H01L 29/66545; H01L 21/823431; H01L 21/845; H01L 21/823821; H01L 27/1211
See application file for complete search history.

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 2006/0063348 A1* | 3/2006 | Chen ................ H01L 21/76235 438/403 |
| 2014/0256136 A1* | 9/2014 | Tsai ................ H01L 29/66795 438/696 |
| 2014/0282326 A1 | 9/2014 | Chen et al. |
| 2015/0044829 A1* | 2/2015 | Kim ................ H01L 21/823807 438/199 |

* cited by examiner

FINFET WITH A SEMICONDUCTOR STRIP AS A BASE

PRIORITY CLAIM AND CROSS-REFERENCE

This application claims the benefit of the following provisionally filed U.S. Patent application: Application Ser. No. 62/312,763, filed Mar. 24, 2016, and entitled "Novel Fin Pattern to Achieve High Height and Small Pitch without Fin Collapse and Peeling;" which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
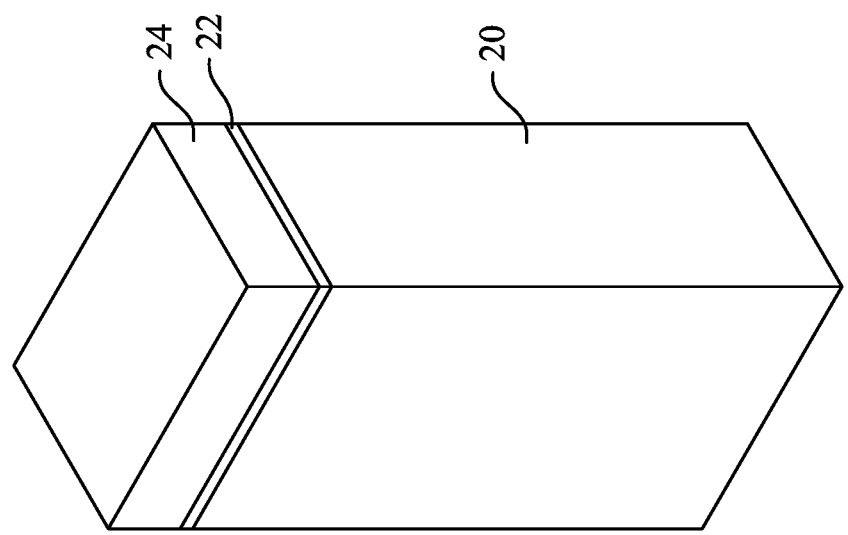
FIGS. 1 through 12 are perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 17:
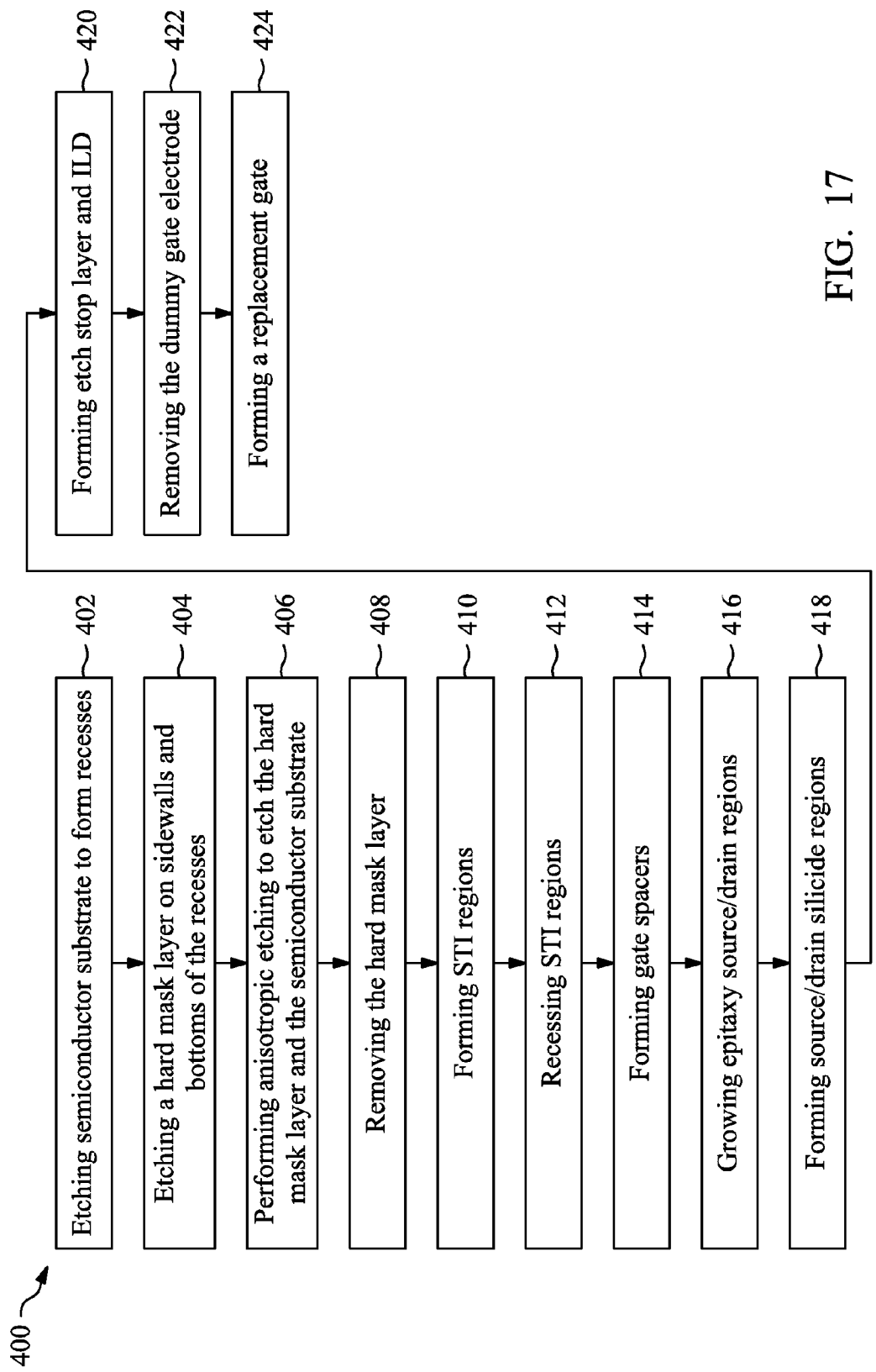
FIG. 17 illustrates a process flow for forming a FinFET in accordance with some embodiments.

FIGS. 1 through 12 illustrate the perspective views and cross-sectional views of intermediate stages in the formation of a FinFET in accordance with some embodiments. The steps shown in FIG. 1 through 12 are also illustrated schematically in the process flow 400 shown in FIG. 17. In the subsequent discussion, the process steps shown in FIGS. 1 through 12 are discussed referring to the process steps in FIG. 17.

FIG. 1 illustrates a perspective view of substrate 20, which is a part of a wafer. Substrate 20 is a semiconductor substrate such as a silicon substrate, a silicon carbon substrate, a silicon-on-insulator substrate, or a substrate formed of other semiconductor materials. Substrate 20 may also include other semiconductor materials such as III-V compound semiconductor materials. Substrate 20 may be lightly doped with a p-type or an n-type impurity.

Pad oxide 22 and hard mask 24 are formed over semiconductor substrate 20. In accordance with some embodiments of the present disclosure, pad oxide 22 is formed of silicon oxide, which may be formed by oxidizing a surface layer of semiconductor substrate 20. Hard mask 24 may be formed of silicon nitride, silicon oxynitride, silicon carbide, silicon carbo-nitride, or the like.

Figure 2:
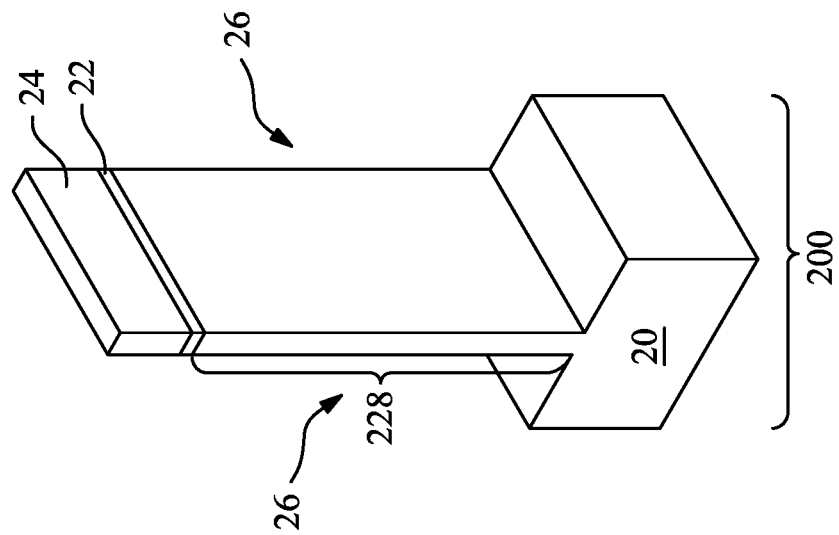
Figure 2:
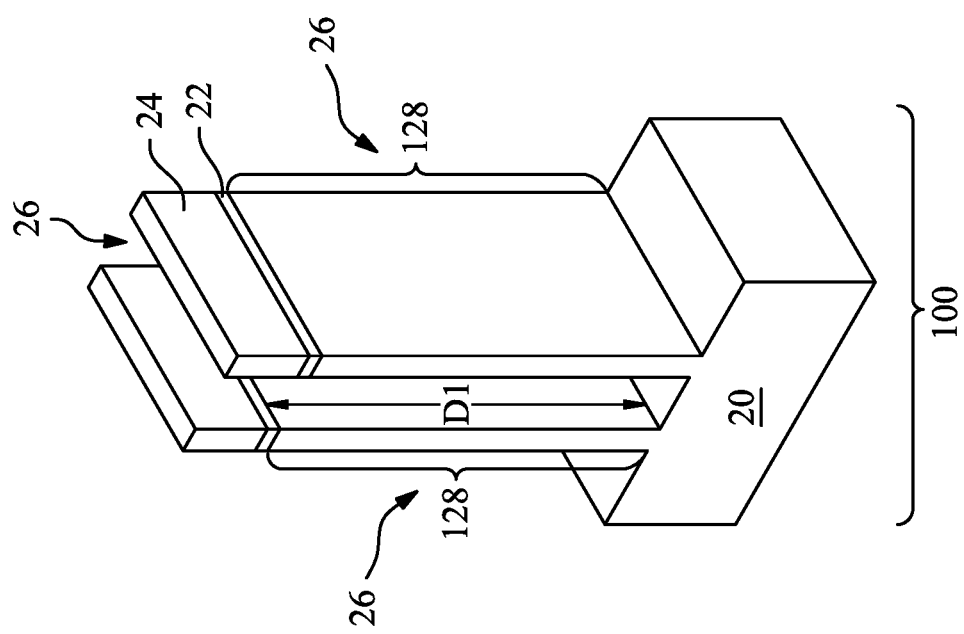

Next, as shown in FIG. 2, hard mask 24, pad oxide 22, and substrate 20 are patterned to form trenches 26. Accordingly, semiconductor strips 128 and 228 are formed. Trenches 26 extend into semiconductor substrate 20, and have lengthwise directions parallel to each other. In accordance with some embodiments of the present disclosure, depth D1 of trenches 26 are in the range between about 80 nm and about 130 nm. It is appreciated that the values recited throughout the description are examples, and different values may also be adopted without changing the principle of the present disclosure.

Substrate 20 includes portions in two device regions, namely multi-fin device region 100 and single-fin device region 200. Semiconductor strips 128 and 228 are formed in regions 100 and 200, respectively. In multi-fin device region 100, a FinFET formed on a plurality of semiconductor fins is to be formed. In single-fin device region 200, a FinFET including only a single semiconductor fin is to be formed. Throughout the description, two fins are illustrated in multi-fin device region 100 as an example, and more fins may be formed in multi-fin device region 100.

Figure 3A:
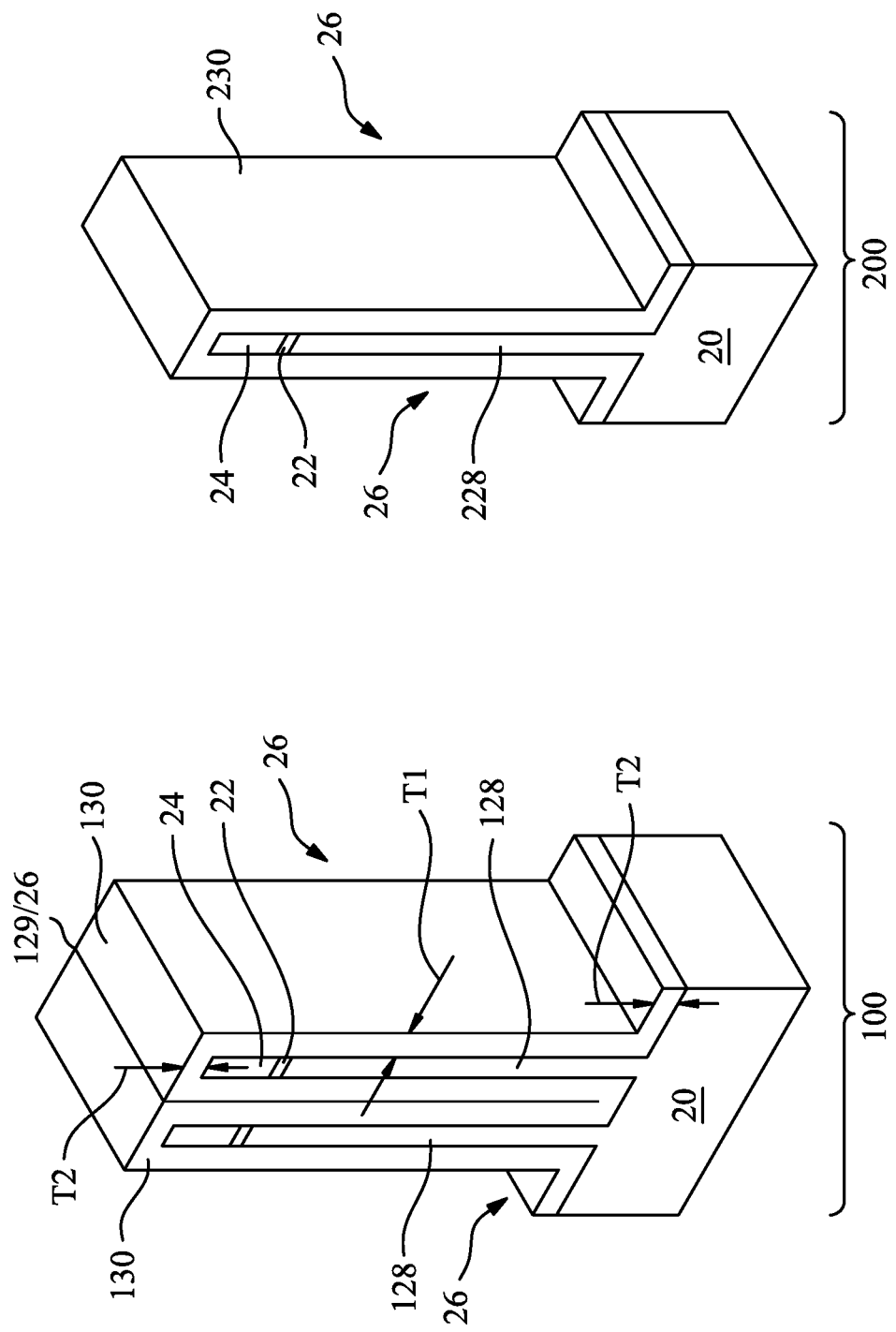

Referring to FIG. 3A, hard mask layers 130 and 230 are formed in multi-fin device region 100 and single-fin device region 200, respectively. Hard mask layers 130 and 230 are formed simultaneously in a same deposition process, and are formed on the top surfaces and sidewalls of semiconductor strips 128 and 228. Furthermore, hard mask layers 130 and 230 extend on the top surface of semiconductor substrate in trenches 26. The deposition method is selected so that the resulting hard mask layers 130 and 230 are substantially conformal, with the thickness T1 of the vertical portions equal to or substantially equal to thickness T2 of the horizontal portions. For example, thickness T1 may be between about 80 percent and 100 percent of thickness T2. In accordance with some embodiments of the present disclosure, the deposition method includes Atomic Layer Deposition (ALD), Low Pressure Chemical Vapor Deposition (LPCVD), or the like.

Figure 3B:
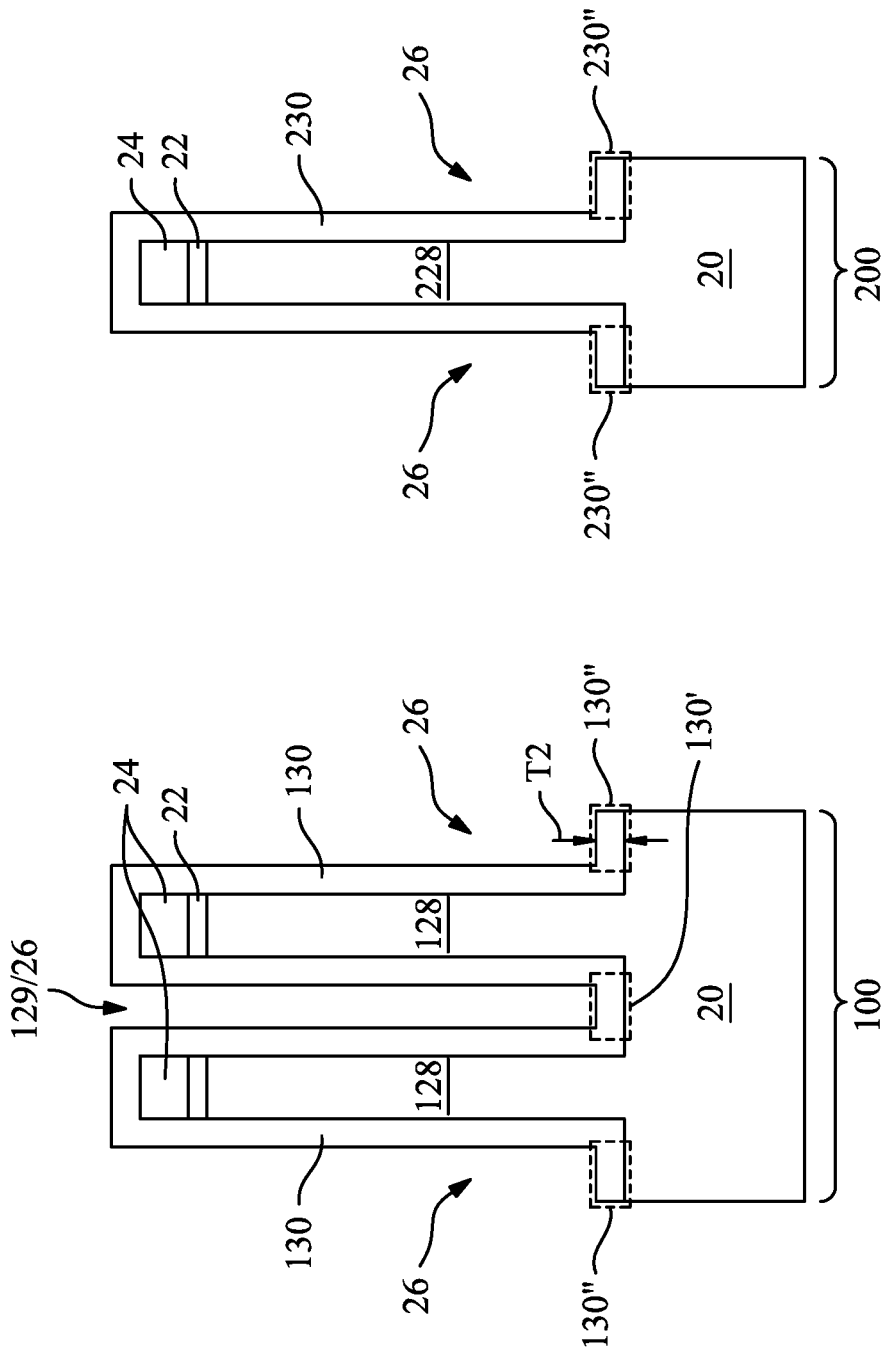

Hard mask layers 130 and 230 may be formed of aluminum oxide ($Al_2O_3$), silicon nitride, silicon oxide, or the like. Hard mask layer 130 includes two vertical portions between semiconductor strips 128, each on the sidewall of one of semiconductor strips 128. The two neighboring vertical portions of hard mask layer 130, although appear to be joined with a seam therebetween, are actually not joined. FIG. 3B illustrates cross-sectional views of the structures in multi-fin device region 100 and single-fin device region 200, which shows gap 129 between two neighboring vertical portions of hard mask layer 130. Gap 129 has a very high aspect ratio, which may be greater than about 15, and may be between about 15 and about 30. It is appreciated that gap 129 is the unfilled portion of the respective trench 26. In subsequent discussion, the term "outer trenches" are used to refer to trenches 26 that are on the outer sides (the illustrated left side and right side) of the outmost semiconductor strips 128.

Figure 4:
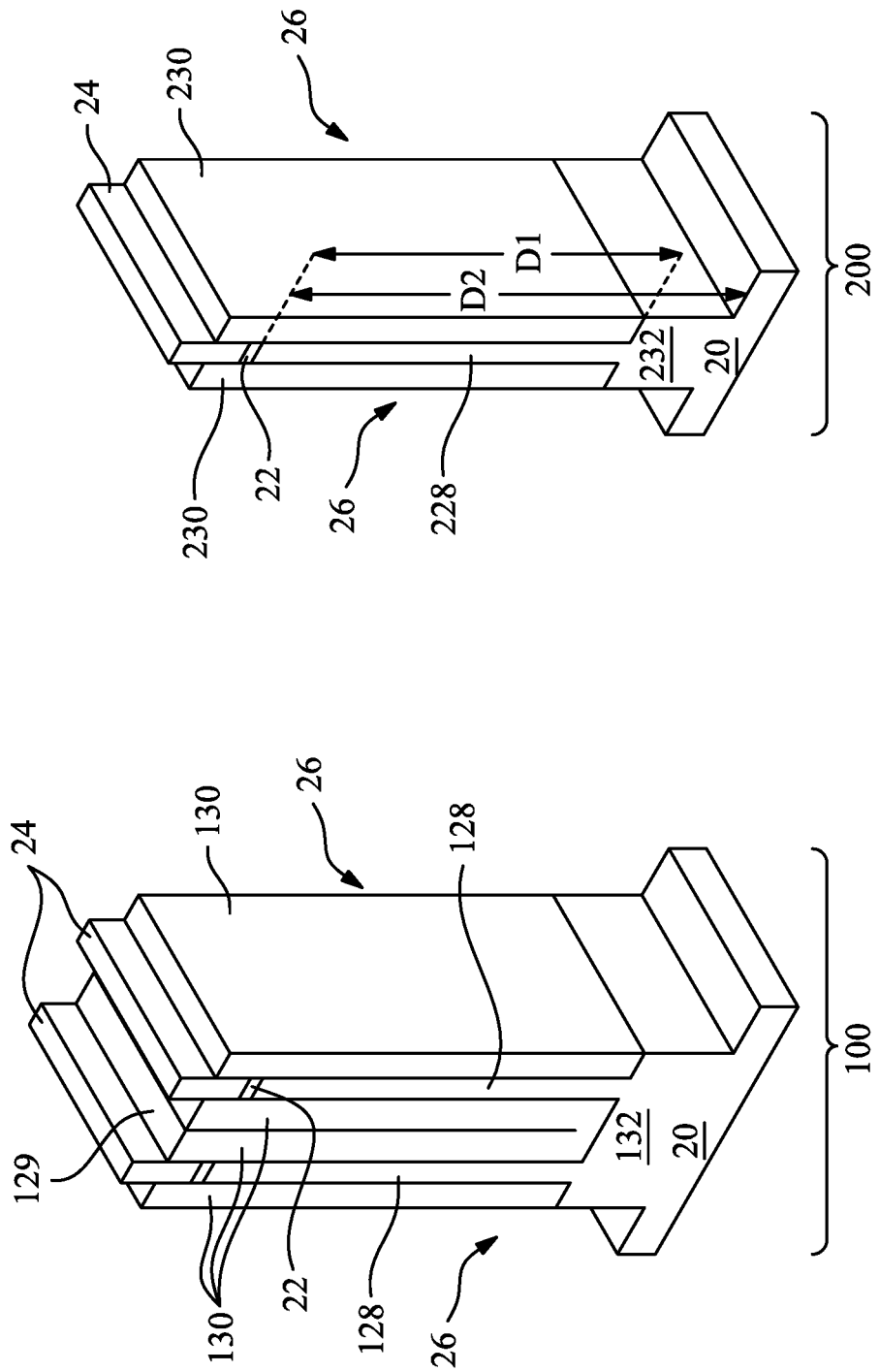

Next, referring to FIG. 4, a first anisotropic etch is performed to remove the horizontal portions of hard mask layers 130 and 230. The first anisotropic etch is performed through dry etch using, for example, hydrogen fluoride (HF) as an etching gas. The vertical portions of hard mask layers 130 and 230 on the sidewalls of semiconductor strips 128 and 228 remain after the first anisotropic etch.

As a result of the etching, the top surfaces of hard masks 24 are exposed. Furthermore, the top surfaces of semiconductor substrate 20 at the bottom of trenches 26 are also exposed. After the first anisotropic etch, a second anisotropic etch is performed to further etch semiconductor substrate 20, so that trenches 26 further extend lower than the bottom edges of hard mask layers 130 and 230. In accordance with some embodiments of the present disclosure, depth D2 of trenches 26 is increased to be in the range between about 120 nm and about 160 nm. The depth difference (D2-D1) may be in the range between about 30 nm and about 50 nm.

In accordance with some embodiments of the present disclosure, the second anisotropic etch is performed using an etchant gas different from the etchant gas used in the first anisotropic etch. In accordance with alternative embodiments, the first and the second anisotropic etches are performed using a same etchant gas such as a fluorine-containing gas or a chlorine-containing gas. The first and the second anisotropic etch steps may be performed in a same process chamber with no break in between. Throughout the description, the portions of semiconductor substrate over the bottoms of the extended outer trenches 26 and underlying semiconductor strips 128 and 228, are referred to as semiconductor strip bases 132 and 232, respectively, which are the bases over which semiconductor strips 128 and 228 are resided. Semiconductor strip bases 132 and 232 are over the bulk portions of semiconductor substrate 20.

In the second etching step, hard masks 24 and the vertical portions of hard mask layer 130 and 230 are in combination used as the etching mask for the second anisotropic etch, and hence the sidewalls of semiconductor strip bases 132 and 232 may be vertically aligned to the outer sidewalls of the vertical portions of hard mask layers 130 and 230. Depending on the etching process, there may be some undercuts formed, resulting in the exposed sidewalls of semiconductor strip bases 132 and 232 to be tilted and recessed from the respective outer edges of the vertical portions of hard mask layers 130 and 230.

Referring back to FIG. 3B, in gap 129, horizontal portion 130' of hard mask layer 130 is at the bottom of, and is exposed to, gap 129. Horizontal portion 130' may have a thickness equal to thickness T2, which is the thickness of portion 130" in outer trenches 26. Outer trenches 26 have a lower aspect ratio than gap 129. In accordance with some embodiments, due to the high aspect ratio of gap 129 (FIG. 3B), in the first and the second anisotropic etch processes, the etching rate of the bottom portion 130' of hard mask layer 130 under gap 129 is much lower than the etching rate of bottom portions 130" and 230" in outer trenches 26.

Depending on the aspect ratios of gap 129 and trenches 26, the thickness of hard mask layer 130, and the process conditions of the etching, various results may occur, as shown in FIGS. 13 through 16. Also, the results shown in FIGS. 13 through 16 may co-exist on the same semiconductor substrate. For example, it is possible that in the first and the second anisotropic etch processes, portion 130' (FIG. 3B) is not etched-through. As a result, the portion of semiconductor substrate 20 directly underlying portion 130' is not etched. Portion 130' may also be etched-through at a time delayed from the time portions 130" are etched-through. Accordingly, the portion of semiconductor substrate 20 directly underlying portion 130' starts to be etched when the portions of substrate 20 directly underlying portions 130" have been etched for a period of time. Accordingly, the portion of semiconductor substrate 20 directly underlying portion 130' is etched for a shorter period of time than the portion of semiconductor substrate 20 directly underlying portions 130". As a result, the trench 26 between two neighboring semiconductor strips 128 may also extend down into semiconductor substrate 20 during the second etch, however, with a smaller depth than outer trenches 26.

Figure 5:
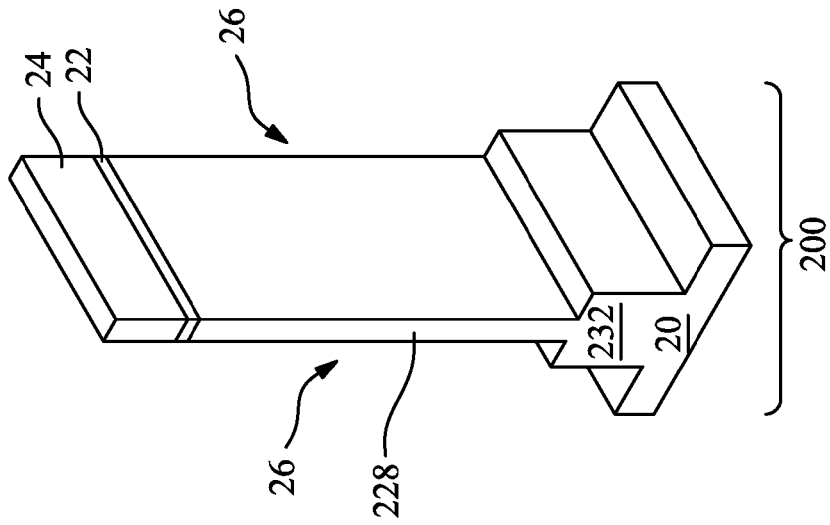
Figure 5:
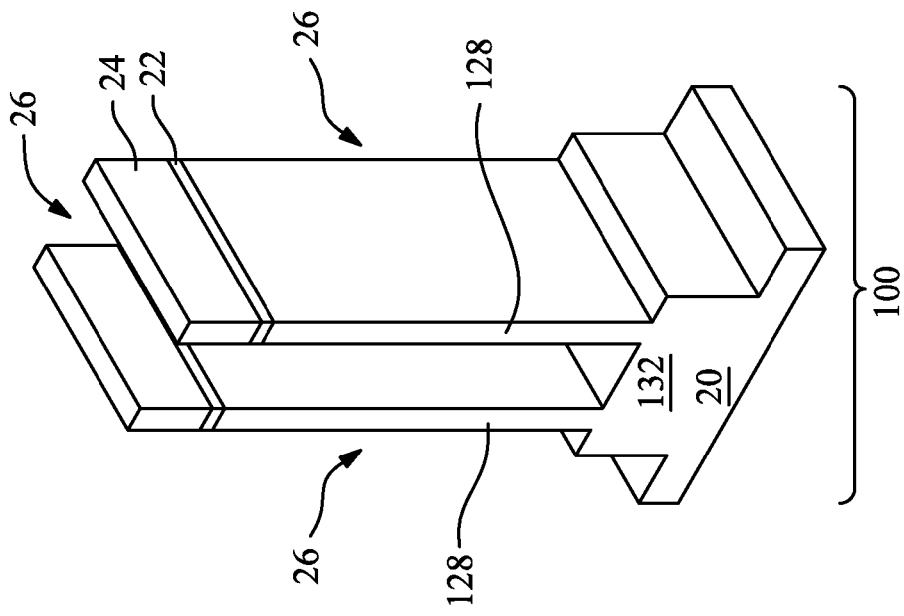

Next, a wet etch is performed to remove remaining portions of hard mask layers 130 and 230, thus exposing the sidewalls of semiconductor strip bases 132 and 232. The resulting structure is shown in FIG. 5. In multi-fin device region 100, a plurality of semiconductor strips 128 stands on the same semiconductor strip base 132, while a single strip 228 stands on semiconductor strip base 232. Throughout the description, semiconductor strip bases 132 and 232 may be considered as parts of substrate 20, or may be considered as parts over substrate 20.

Figure 6:
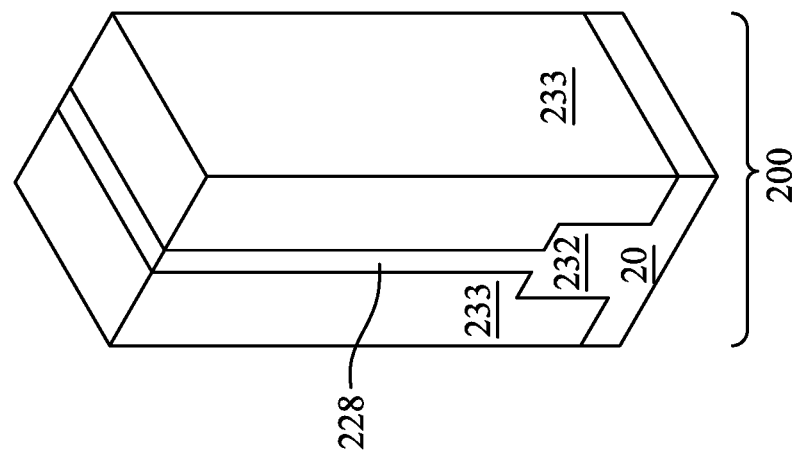
Figure 6:
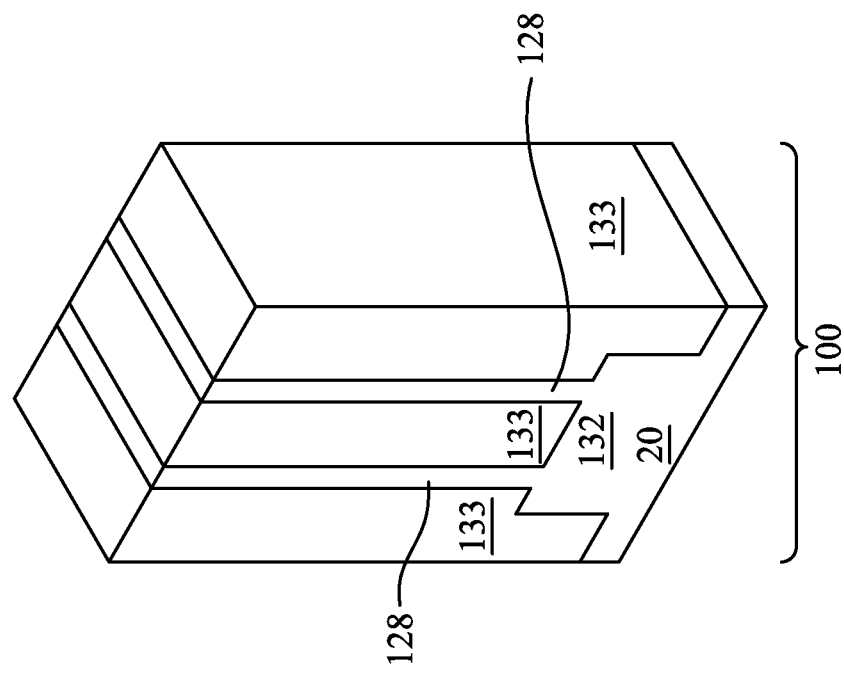

Next, as shown in FIG. 6, isolation regions 133 and 233, which may be Shallow Trench Isolation (STI) regions, are formed in trenches 26 (FIG. 5). The formation may include filling trenches 26 with a dielectric material(s), for example, silicon oxide using Flowable Chemical Vapor Deposition (FCVD), and performing a CMP to level the top surface of the dielectric material with the top surface of hard masks 24. After the CMP, hard masks 24 (FIG. 5) is removed. Alternatively, the polish stops on the top surfaces of semiconductor strips 128 and 228. In a top view of the structure shown in FIG. 6, each of semiconductor strip bases 132 and 232 may be a strip encircled by the respective STI regions 133 and 233, or may be a strip with the opposite ends connected to semiconductor substrate 20.

Figure 7:
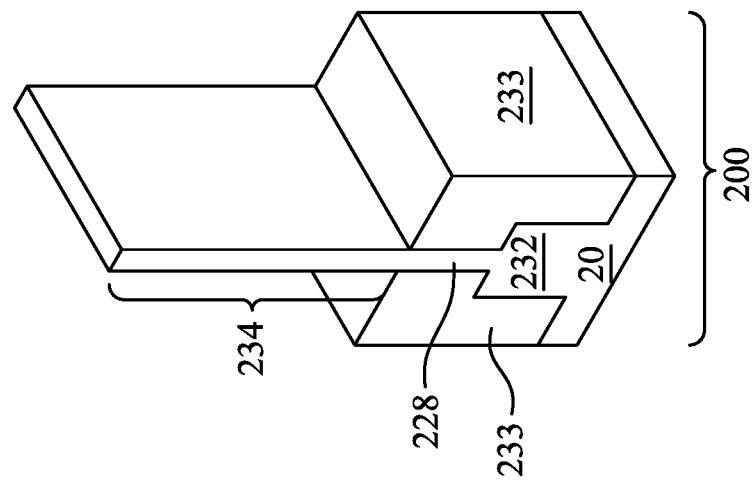
Figure 7:
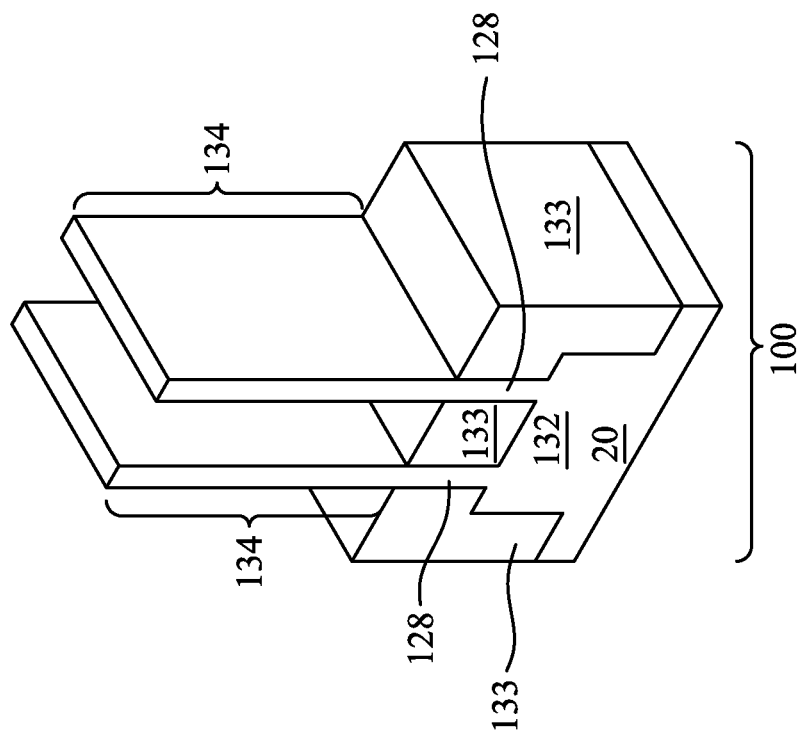

Next, referring to FIG. 7, STI regions 133 and 233 are recessed, so that the top surfaces of the resulting STI regions 133 and 233 are lower than the top surfaces of semiconductor strips 128 and 228. Throughout the description, the portions of semiconductor strips 128 and 228 higher than the top surfaces of STI regions 133 and 233 are referred to as semiconductor fins 134 and 234, respectively. The top surfaces of the remaining STI regions 133 and 233 are further higher than the top surfaces of semiconductor strip bases 132 and 232. Throughout the description, the portions of STI regions 133 between two neighboring semiconductor strips 128 are referred to as inner STI regions 133, while the STI regions 133 on the outer sides of the outmost semiconductor strips 128 are referred to as outer STI regions. STI regions 233 are outer STI regions.

Figure 8:
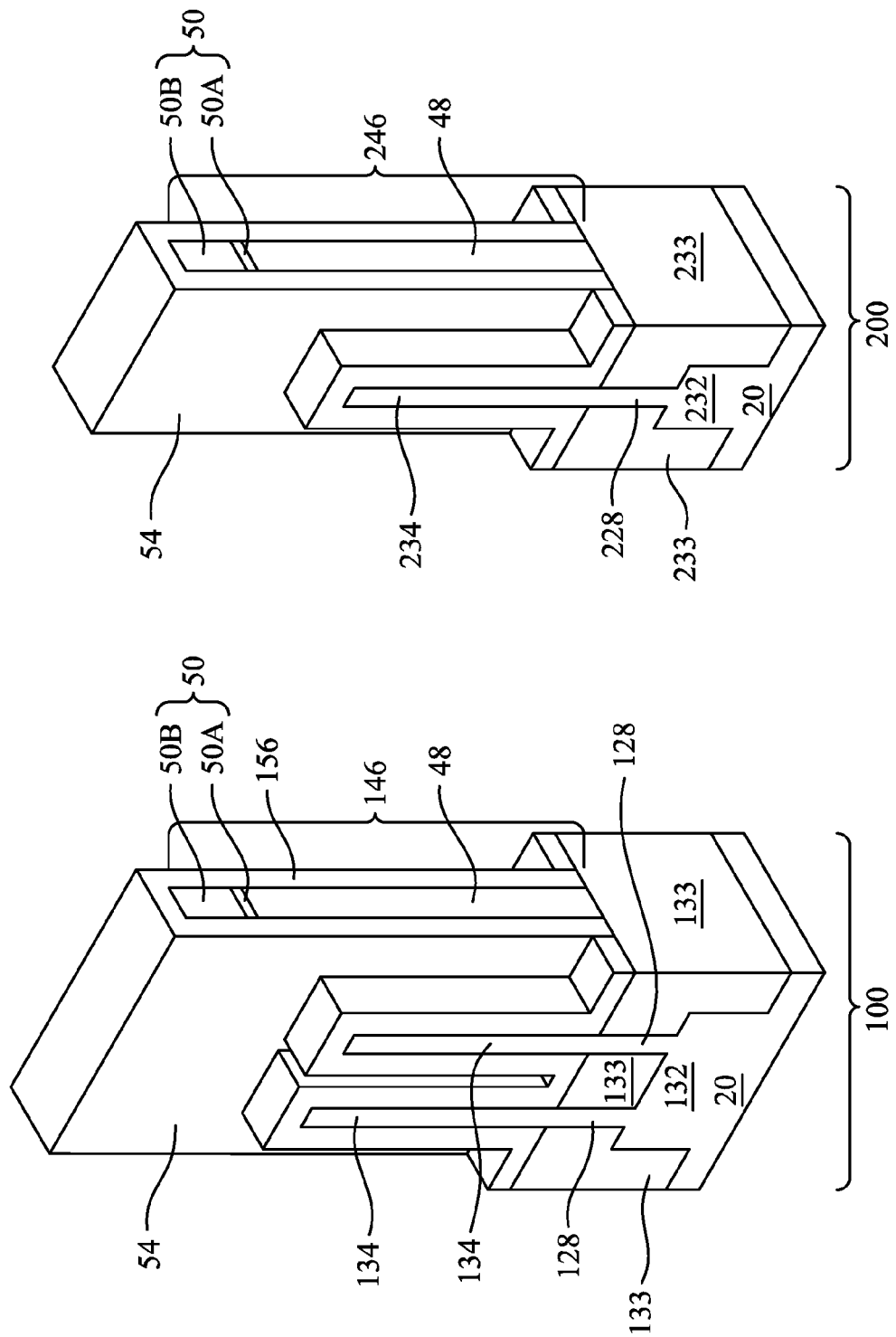

Referring to FIG. 8, dummy gate stacks 146 and 246 are formed on semiconductor fins 134 and 234, respectively. Dummy gate stacks 146 and 246 cover the middle portions of semiconductor fins 134 and 234, respectively, leaving the opposite end portions not covered. In accordance with some embodiments of the present disclosure, dummy gate stacks 146 and 246 include dummy gate electrodes 48, which may be formed of, for example, polysilicon. A dummy oxide layer (not shown) may (or may not) be formed before the formation of dummy gate electrodes 48. Hard masks 50 are formed over dummy gate electrodes 48, and are used as etching masks for forming dummy gate electrodes 48. Hard masks 50 may include silicon nitride and/or silicon oxide, for example, and may be a single layer or a composite layer including a plurality of layers. For example, hard masks 50 may include pad oxides 50A and silicon nitride layers 50B over pad oxides 50A. Pad oxides 50A may be formed of silicon oxide, which may be formed by oxidizing the top surface layers of dummy gate electrodes 48. The formation of dummy gate stacks 146 and 246 may include depositing the respective layers as blanket layers, and then etching the blanket layers. Dummy gate stacks 146 and 246 may have lengthwise directions substantially perpendicular to the lengthwise direction of the respective semiconductor fins 134 and 234.

Referring further to FIG. 8, spacer layer 54 is formed in both device regions 100 and 200. In accordance with some embodiments of the present disclosure, spacer layer 54 is formed of silicon oxide, silicon nitride, silicon oxynitride, or multi-layers thereof. For example, spacer layer 54 may include a silicon oxide layer, and a silicon nitride layer over the silicon oxide layer. Spacer layer 54 is formed using a conformal deposition method such as ALD.

Figure 9:
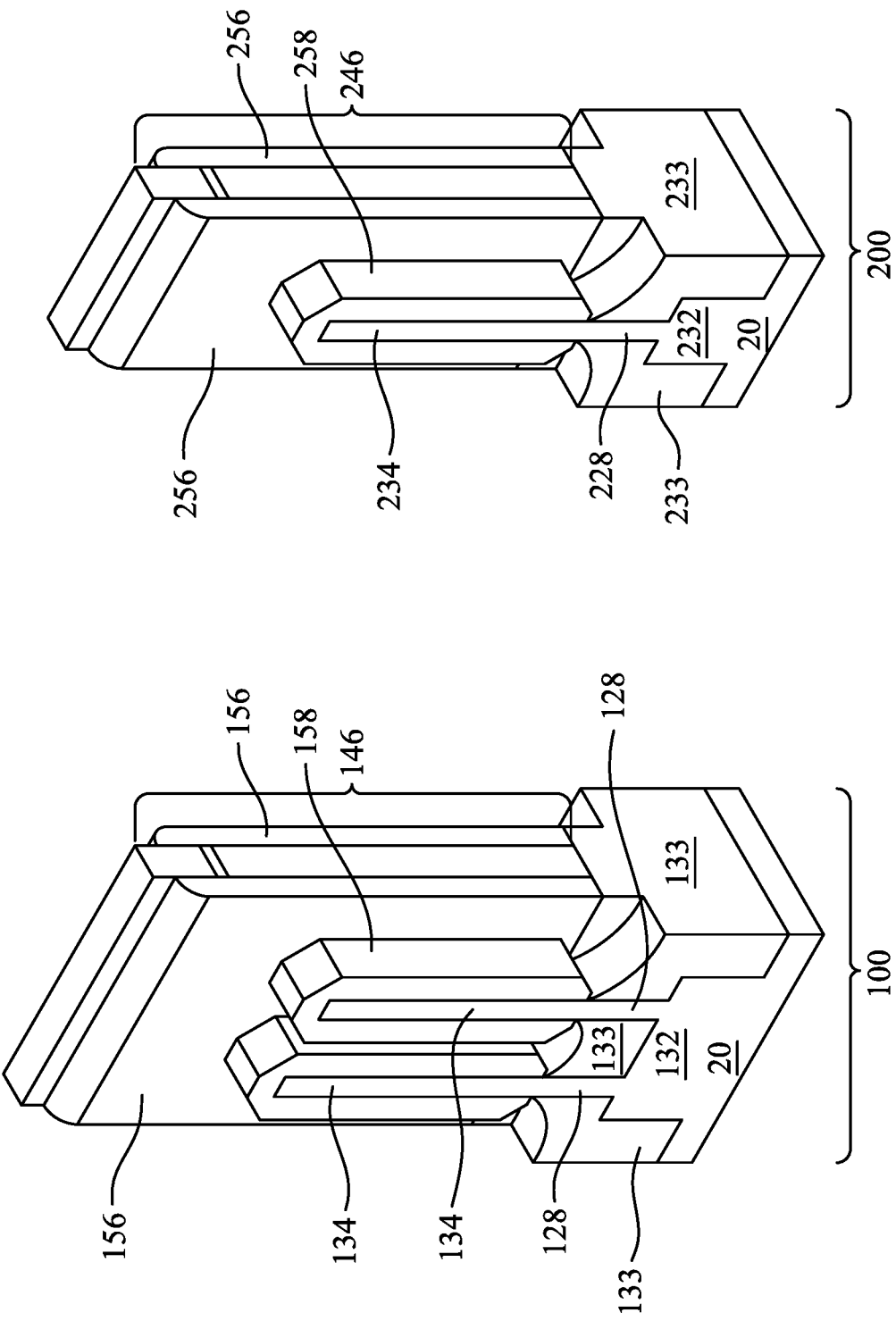

FIG. 9 illustrates the etching of spacer layer 54 to form gate spacers 156 and 256, which are on the sidewalls of dummy gate stacks 146 and 246, respectively. In accordance with some embodiments, an anisotropic etch is performed to etch spacer layer 54. The horizontal portions of spacer layer 54 are removed. In addition, since the heights of semiconductor fins 134 and 234 are lower than that of dummy gate stacks 146 and 246, the heights of the vertical portions of spacer layer 54 on the sidewalls of semiconductor fins 134 and 234 are relatively small, and hence may be removed. On the other hand, the vertical portions of spacer layer 54 on the sidewalls of dummy gate stacks 146 and 246 are relatively small, and have portions remaining after the etching. The remaining portions of spacer layer 54 are gate spacers 156 and 256. Due to the etching, the top surfaces of gate spacers 156 and 256 are recessed from the top surfaces of dummy gate stacks 146 and 246.

In the formation of gate spacers 156 and 256, the top surfaces of the exposed STI regions 133 and 233 may also be recessed by the etchant and the chemicals used in the respective etching and cleaning processes. To ensure that semiconductor strip bases 132 and 232 are not exposed after the recessing of STI regions 133 and 233, the portions of STI regions 133 and 233 over top surfaces of semiconductor strip bases 132 and 232 are designed to have an adequate thickness when the structure shown in FIG. 7 is formed.

After the formation of gate spacers 156 and 256, as also shown in FIG. 9, a source/drain epitaxy is performed to grow epitaxy semiconductor regions 158 and 258 on the exposed end portions of semiconductor fins 134 and 234, respectively. Epitaxy regions 158 and 258 and the end portions of semiconductor fins 134 and 234 in combination form the source/drain regions of the respective FinFETs. In accordance with some embodiments in which the resulting FinFET is an n-type FinFET, epitaxy regions 158 and 258 comprise silicon phosphorous (SiP) or phosphorous-doped silicon carbon (SiCP). In accordance with alternative embodiments in which the resulting FinFET is a p-type FinFET, epitaxy regions 158 and 258 comprise silicon germanium (SiGe), and a p-type impurity such as boron or indium is in-situ doped during the epitaxy. An implantation may also be performed to dope an n-type or p-type impurity into the source/drain regions of the respective n-type FinFETs or p-type FinFETs.

Figure 10:
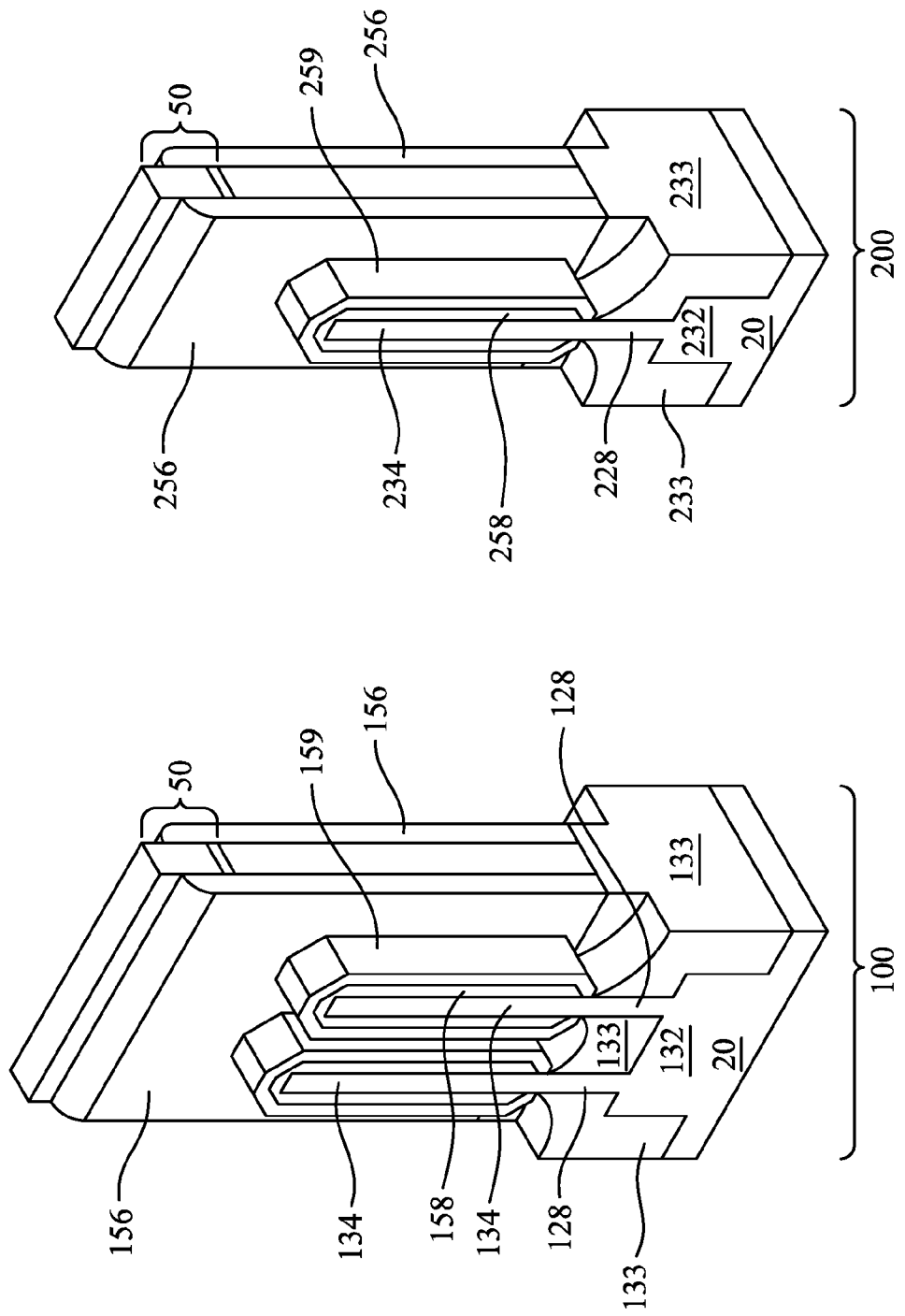

FIG. 10 illustrates the formation of source/drain silicide regions 159 and 259 on epitaxy regions 158 and 258, respectively. The formation of source/drain silicide regions 159 and 259 includes forming a blanket metal layer (not shown) on the structure shown in FIG. 9, wherein the metal layer is formed on the top surfaces and sidewalls of epitaxy regions 158 and 258. An anneal is performed to react the metal layer with epitaxy regions 158 and 258 to form silicide regions 159 and 259. The unreacted metal is then removed, leaving silicide regions 159 and 259.

Figure 11:
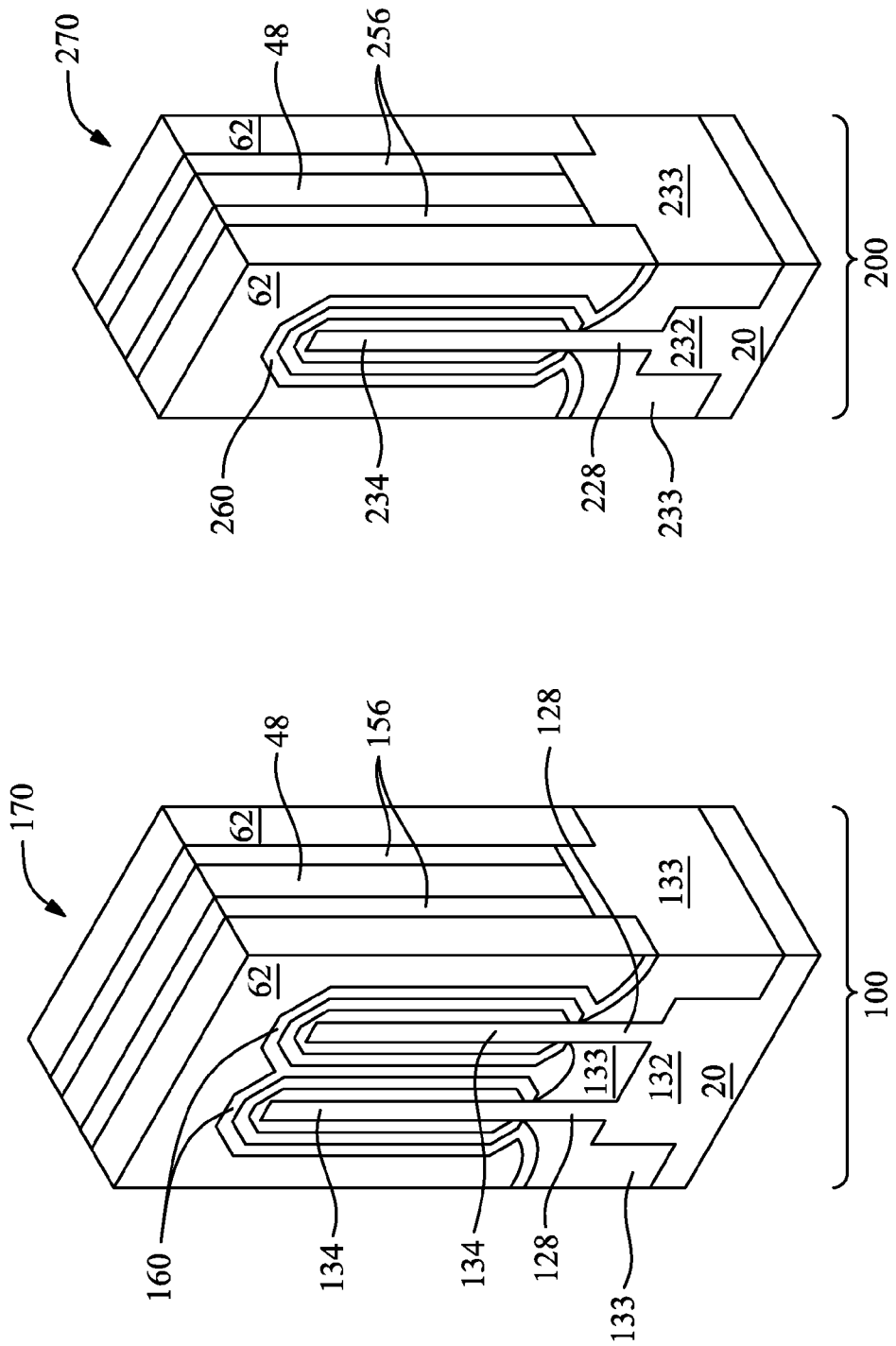

Next, as shown in FIG. 11, etch stop layer 160 and 260 and Inter-Layer Dielectric (ILD) 62 are formed. A CMP is then performed to level the top surfaces of ILD 62, dummy gate stacks 146 and 246 (FIG. 10), and gate spacers 156 and 256 (FIG. 10) with each other. In accordance with some embodiments, the CMP is performed until dummy gate electrodes 48, which are formed of polysilicon, are exposed. In accordance with alternative embodiments, the CMP stops on hard masks 50 (FIG. 1), which are formed of polysilicon, are exposed.

Figure 12:
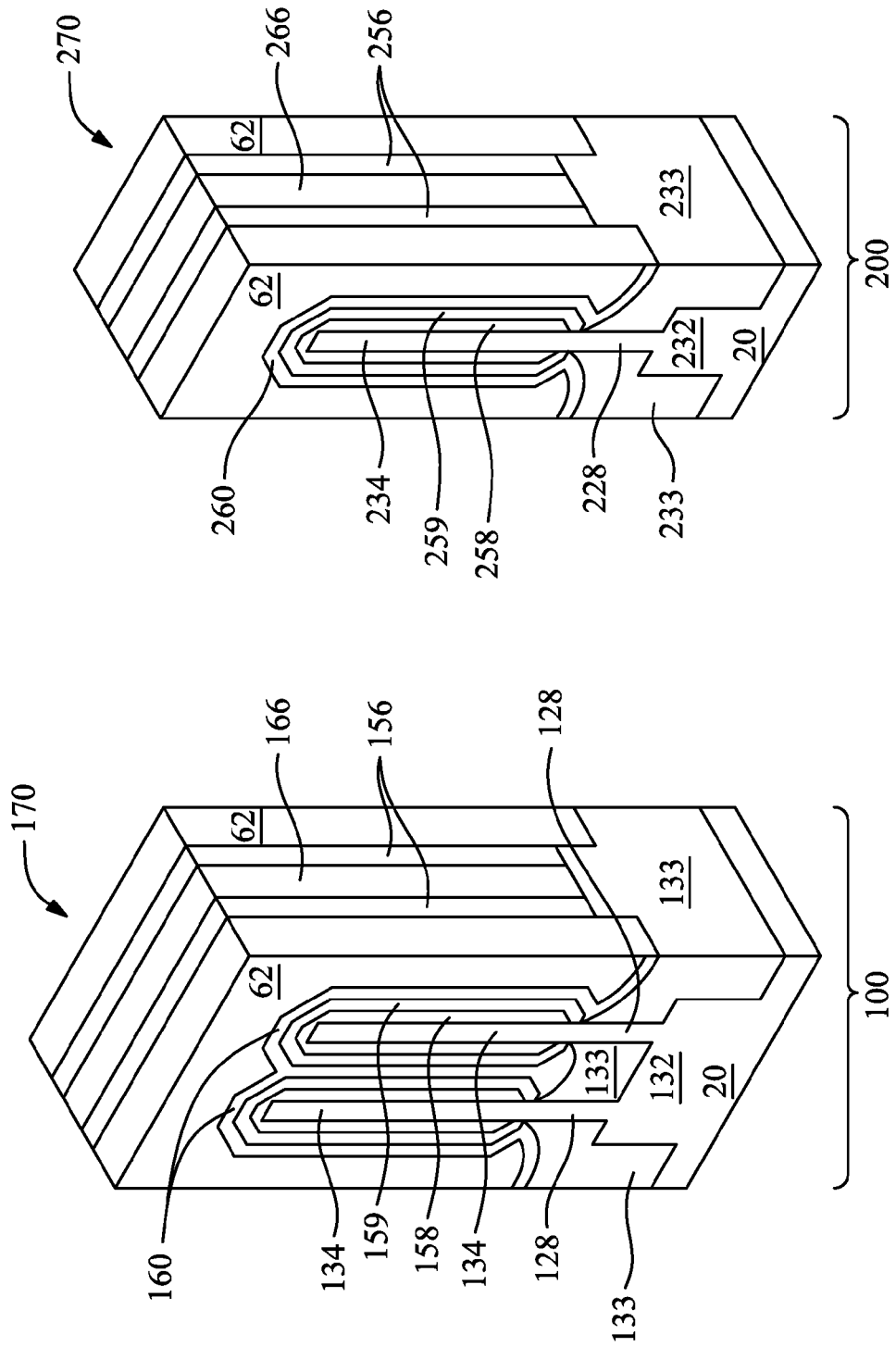

Next, dummy gate stacks 146 and 246 as shown in FIG. 10 are removed in an etching step, so that recesses (not shown, occupied by replacement gates 164 and 264 as shown in FIG. 12) are formed to extend into ILD 62, as shown in FIG. 12. The portions of Semiconductor fins 134 and 234 covered by dummy gate stacks 146 and 246 are exposed to the recesses.

Next, replacement gate stacks 166 and 266 are formed in the recesses left by the removed dummy gate electrodes, as also shown in FIG. 12. Replacement gate stacks 166 and 266 may include a plurality of dielectric layers as replacement gate dielectrics 163 and 263 (FIGS. 13 through 16), and a plurality of conductive layers as replacement gate electrodes 164 and 264 (FIGS. 13 through 16). In accordance with some embodiments, the formation of each of replacement gate dielectrics 162 and 262 includes performing an interfacial (dielectric) layer, and then forming a high-k dielectric layer on the interfacial layer. The interfacial layer may include silicon oxide formed by treating the exposed surface of semiconductor fins 134 and 234 in a chemical solution, so that semiconductor fins 134 and 234 are oxidized to form a chemical oxide (silicon oxide). The high-k dielectric is then deposited on the interfacial layer. In accordance with some embodiments, the high-k dielectric has a k value greater than about 7.0, and may include a metal oxide or a silicate of Hf, Al, Zr, La, and the like.

Gate electrodes 164 and 264 (FIGS. 13 through 16) in replacement gate stacks 166 and 266 are formed over the replacement gate dielectrics 163 and 263, respectively. Replacement gate electrodes 164 and 264 may include a metal-containing material such as TiN, TaN, TaC, Co, Ru, Al, Cu, W, combinations thereof, or multi-layers thereof. After the formation of the replacement gate dielectrics and the replacement gate electrodes, a planarization such as a CMP is performed to remove excess portions over ILD 62. The result structure includes multi-fin FinFET 170 in multi-fin device region 100, and single-fin FinFET 270 in single-fin device region 200.

Figure 13:
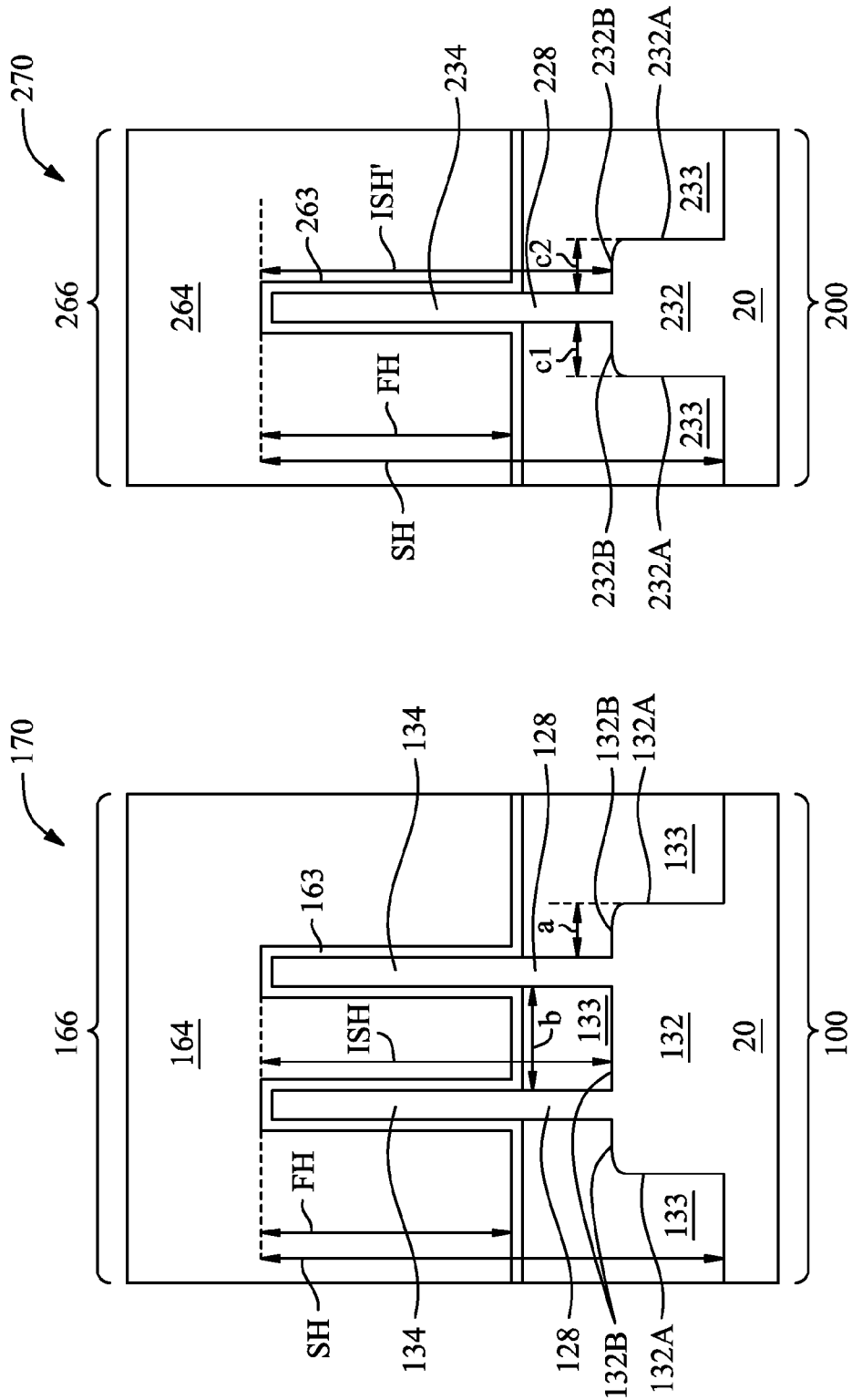
FIGS. 13 through 16 illustrate the cross-sectional views of FinFETs in accordance with some embodiments.
Figure 14:
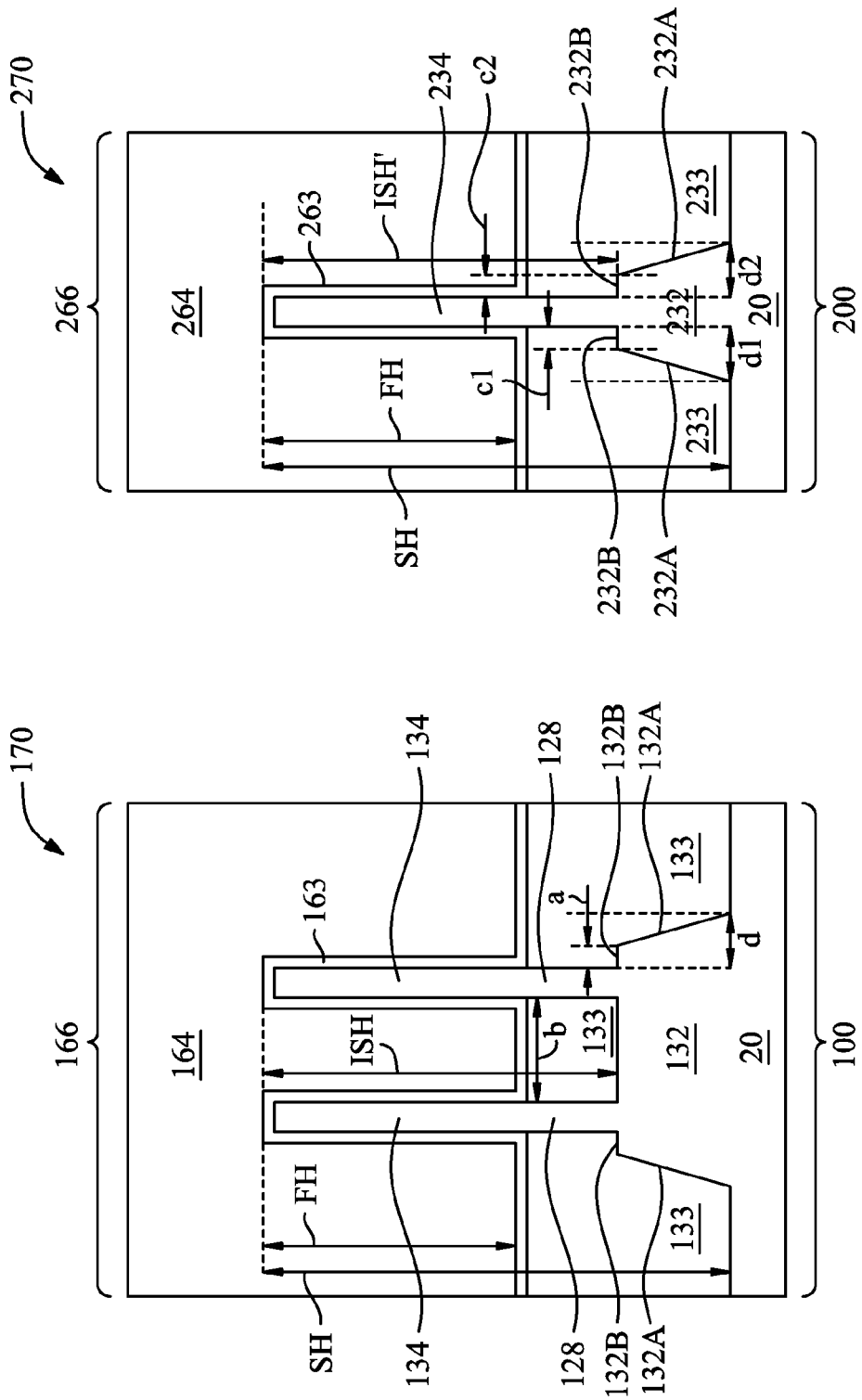
Figure 15:
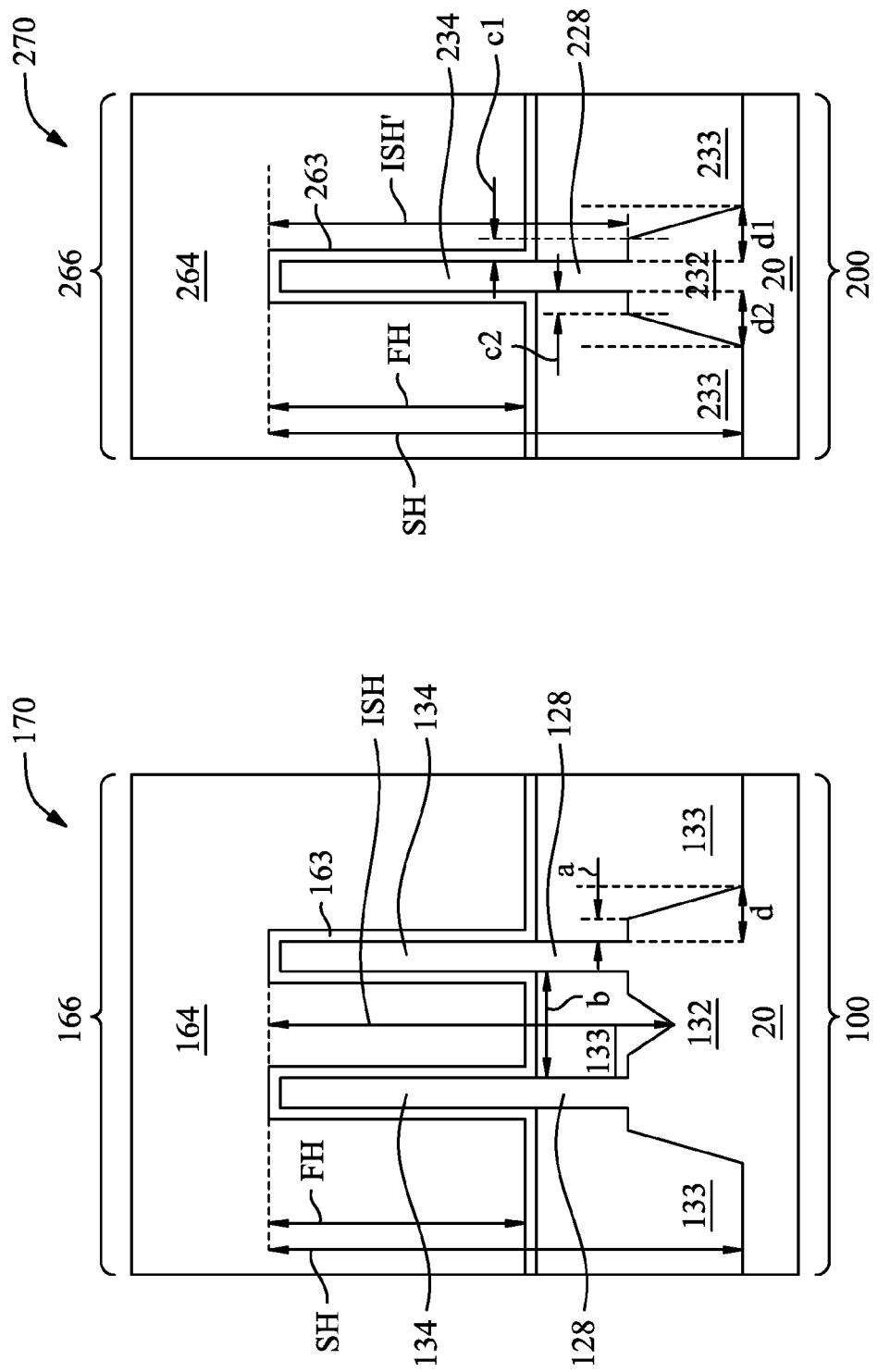

FIGS. 13 through 16 illustrate the cross-sectional views of some portions of FinFETs 170 and 270 in FIG. 15, wherein the cross-sectional view are obtained from vertical planes perpendicular to the channel-length directions of FinFETs 170 and 270. In each of FIGS. 13 through 16, the inner surfaces and bottom surfaces of outer STI regions 133 (the STI region 133 on the left of the leftmost semiconductor fin 134 and the STI region 133 on the right of the rightmost semiconductor fin 134) are symmetric to each other. This is because the profiles of outer STI regions 133 are generated by the leftmost vertical portion and the rightmost vertical portion of hard mask layers 130 (FIG. 4), which are symmetric to each other. The inner sidewalls and bottom surfaces of the left STI region 233 are also symmetric to that of the right STI region 233, which symmetry is the result of the symmetry of the vertical portions of hard mask 230 (FIG. 4) on opposite sidewalls of semiconductor strip 228.

FIG. 13 illustrates the cross-sectional views of some portions of FinFETs 170 and 270 in accordance with some embodiments. Semiconductor strip bases 132 and 232 have substantially vertical sidewalls 132A and 232A, which are connected to the substantially planar top surfaces 132B and 232B, respectively. The sidewalls of semiconductor strips 128 and 228 form steps with top surfaces 132B and sidewalls 132A of semiconductor strip base 132. Inner STI region 133 has its bottom surface in contact with top surface 132B of semiconductor strip base 132. Each of STI regions 233 and outer STI regions 133 may have two substantially planar bottom surfaces at different levels, with the higher one being in contact with the planar top surfaces 132B and 232B of semiconductor strip bases 132 and 232, respectively, and the lower ones being in contact with the planar top surfaces of semiconductor substrate 20.

FIG. 14 illustrates the cross-sectional views of some portions of FinFETs 170 and 270 in accordance with some embodiments. Semiconductor strip bases 132 and 232 have titled sidewalls 132A and 232A, wherein tilt angles α may be smaller than about 80 degrees. Titled sidewalls 132A and 232A are connected to the substantially planar top surfaces 132B and 232B. Titled sidewalls 132A and 232A may also be substantially straight. The sidewalls of semiconductor strips 128 also form steps with planar top surfaces 132B and tilted sidewalls 132A of semiconductor strip base 132. The sidewalls of semiconductor strip 228 also form steps with planar top surfaces 232B and tilted sidewalls 232A of semiconductor strip base 232. Inner STI region 133 also has a planar bottom surface in contact with the top surface of semiconductor strip base 132.

FIG. 15 illustrates the cross-sectional views of some portions of FinFETs 170 and 270 in accordance with some embodiments. These embodiments are similar to the embodiments shown in FIG. 14, except that the portion of semiconductor substrate 20 directly under inner STI region 133 is etched. Accordingly, inner STI region 133 extends into semiconductor strip base 132. The bottom surfaces of inner STI region 133 may have a V-shape in the cross-sectional view. The bottom tip of the V-shape is higher than the bottommost surface of outer STI regions 133.

Figure 16:
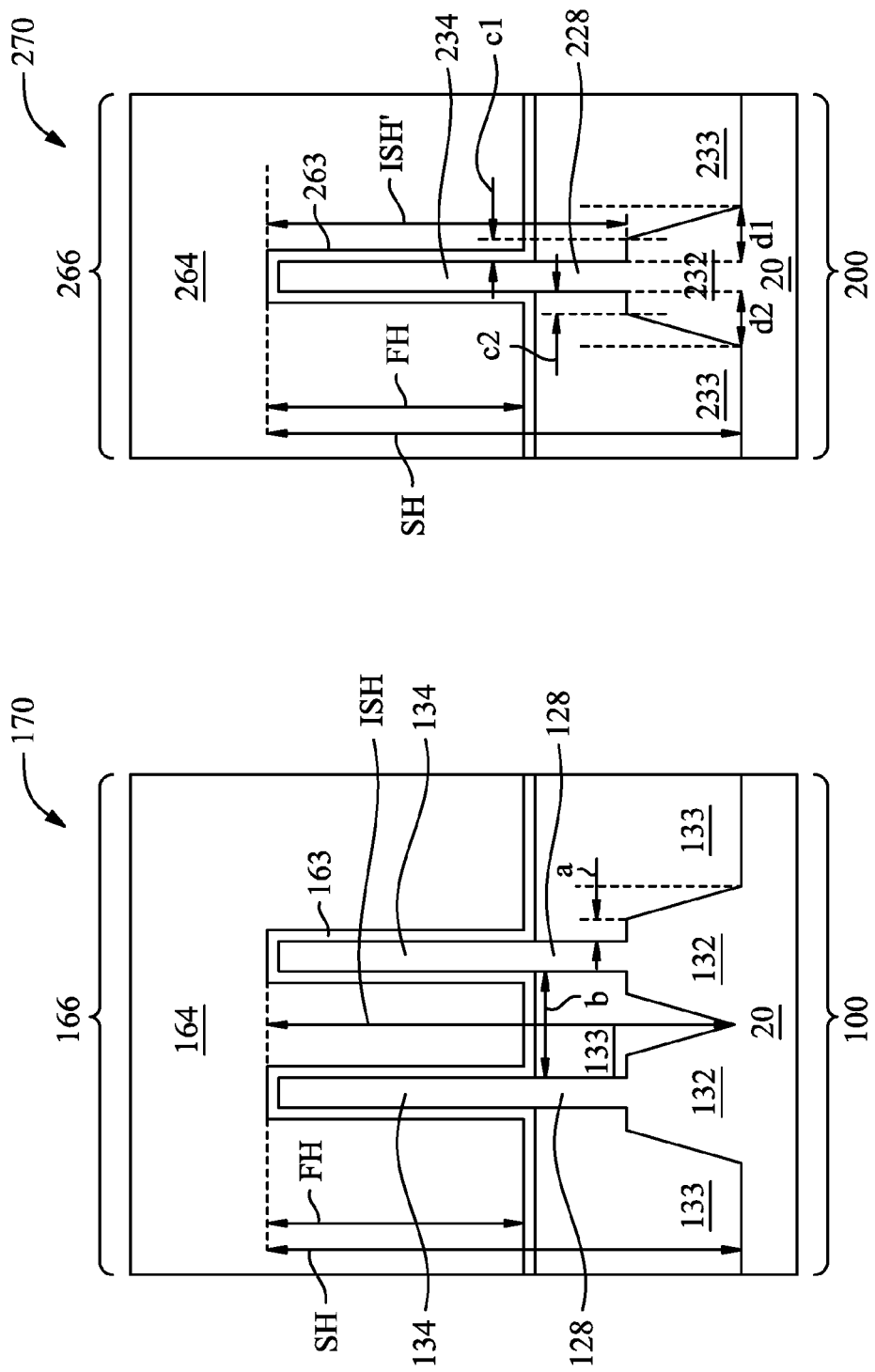

FIG. 16 illustrates the cross-sectional views of some portions of FinFETs 170 and 270 in accordance with some embodiments. These embodiments are similar to the embodiments shown in FIG. 15, except that the portion of semiconductor substrate 20 directly under inner STI region 133 is etched deeper, and the bottom tip of inner STI region 133 is coplanar with the bottom planar surface of outer STI regions 133. Accordingly, semiconductor strip base 132 is effectively separated into a plurality of discrete semiconductor strip bases, each having a single semiconductor strip 128 over it. The bottom surface of inner STI region 133 may have a V-shape or a U-shape in the cross-sectional view. The U-shape has opposite sidewalls being straight and tilted, and the bottom surface being planar. The opposite sidewalls of the discrete portions of semiconductor strip base 132 may have an asymmetric profile due to the different etching of portions 130' and 130" in FIG. 4.

A plurality of dimensions is provided for the embodiments in FIGS. 13 through 16 in accordance with some exemplary embodiments. It is appreciated that these values are examples, and may be changed to different values. For example, in FIGS. 13 through 16, distance "a" is equal to distance "c1" and "c2" (which are further greater than about 1 nm) since the sidewall portions of hard mask layers 130 and 230 have substantially the same width. Distance "b" between neighboring semiconductor strips 128 is greater than two times the distance "a" to allow a gap therein.

The following relationships of the dimensions shown in FIGS. 14 through 16 may also be adopted:

$$1 \text{ nm} < a <= b/2$$

$$d = a + 0 \sim 8 \text{ nm}$$

$$a = c1 = c2, d = d1 = d2$$

$$d1 = c1 = 0 \sim 8 \text{ nm}$$

$$d2 = c2 + 0 \sim 8 \text{ nm}$$

In addition, some exemplary values of the dimensions are provided in Tables 1 and 2, wherein the values in Table 1 are for the structure shown in FIGS. 13 and 14, and the values in Table 2 are for the structure shown in FIGS. 15 and 16. It is appreciated that the provided values are merely examples.

TABLE 1

| Dimension | Values |
| --- | --- |
| FH | 10 nm~100 nm |
| SH | 120 nm~160 nm |
| ISH and ISH' | 80 nm~130 nm |
| FH/SH | 0.3~0.6 |
| ISH/SH | 0.5~0.8 |

TABLE 2

| Dimension | Values |
| --- | --- |
| FH | 10 nm~100 nm |
| SH | 120 nm~160 nm |
| ISH' | 80 nm~130 nm |
| ISH | 100 nm~160 nm |
| FH/SH | 0.3~0.6 |
| ISH/SH | 0.7~1.0 |

The embodiments of the present disclosure have some advantageous features. By forming semiconductor strip bases underlying semiconductor strips/fins, the heights of semiconductor strips may be maintained while the aspect ratio of the semiconductor strips is reduced. Accordingly, the problems that will otherwise occur to high-aspect ratio semiconductor strips are eliminated. For example, in the cleaning processes of conventional processes, the high-aspect ratio semiconductor strips may bend or lean over and stick to each other, resulting in yield loss or degradation in the performance of the FinFETs. In accordance with the embodiments of the present disclosure, by reducing the aspect ratios of semiconductor strips, semiconductor strips are less likely to bend or lean, and the problems are at least reduced, and possibly eliminated.

In accordance with some embodiments of the present disclosure, a method includes forming a first hard mask over a semiconductor substrate, etching the semiconductor substrate to form recesses, with a semiconductor strip located between two neighboring ones of the recesses, forming a second hard mask on sidewalls of the semiconductor strip, performing a first anisotropic etch on the second hard mask to remove horizontal portions of the second hard mask, and performing a second anisotropic etch on the semiconductor substrate using the first hard mask and vertical portions of the second hard mask as an etching mask to extend the recesses below a bottom end of the vertical portions of the second hard mask. The method further includes removing the vertical portions of the second hard mask, and forming isolation regions in the recesses. The isolation regions are recessed, and a portion of the semiconductor strip between the isolation regions protrudes higher than the isolation regions to form a semiconductor fin. A gate stack is formed on a top surface and sidewalls of the semiconductor fin to form a FinFET.

In accordance with some embodiments of the present disclosure, a method includes forming a semiconductor strip by etching a semiconductor substrate to form recesses on opposite sides of the semiconductor strip, forming a hard mask layer on sidewalls of the semiconductor strip, performing a first etch on the hard mask layer to remove horizontal portions of the hard mask layer, with vertical portions of the hard mask layer remaining, performing a second etch on the semiconductor substrate using the vertical portions of the hard mask layer as parts of an etching mask to extend the recesses below a bottom end of the vertical portions of the hard mask layer, removing the vertical portions of the hard mask layer, forming isolation regions in the recesses, and recessing the isolation regions. A portion of the semiconductor strip between the isolation regions protrudes higher than the isolation regions to form a semiconductor fin. A gate stack is formed on a top surface and sidewalls of the semiconductor fin to form a FinFET, which is a single-Fin FinFET.

In accordance with some embodiments of the present disclosure, a device includes a semiconductor substrate, which includes a bulk portion, and a semiconductor strip base over and joined to the bulk portion. The semiconductor strip base is elongated. The device further includes a semiconductor strip over and joined to the semiconductor strip base, with the semiconductor strip being narrower than the semiconductor strip base. A semiconductor fin is over and joined to the semiconductor strip. Isolation regions extend into the semiconductor substrate. The isolation regions include a first bottom surface contacting a first top surface of the semiconductor strip base, and a second bottom surface contacting a top surface of the bulk portion of the semiconductor substrate. The second bottom surface is lower than the first bottom surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first hard mask over a semiconductor substrate;
    etching the semiconductor substrate to form recesses, with a plurality of semiconductor strips located between two neighboring ones of the recesses;
    forming a second hard mask on sidewalls of the semiconductor strip;
    performing a first anisotropic etch on the second hard mask to remove first horizontal portions of the second hard mask;
    performing a second anisotropic etch on the semiconductor substrate using the first hard mask and vertical portions of the second hard mask remaining after the first anisotropic etch as an etching mask to extend the recesses below a bottom end of the vertical portions of the second hard mask, wherein a horizontal portion of the second hard mask between two neighboring ones of the plurality of semiconductor strips is not etched-through when the second anisotropic etch is started;
    removing the vertical portions of the second hard mask;
    forming isolation regions in the recesses;
    recessing the isolation regions, wherein a portion of the semiconductor strip between the isolation regions protrudes higher than the isolation regions to form a semiconductor fin; and
    forming a gate stack on a top surface and sidewalls of the semiconductor fin to form a Fin Field-Effect Transistor (FinFET).

2. The method of claim 1, wherein the FinFET is a single-fin FinFET.

3. The method of claim 1, wherein the FinFET is a multi-fin FinFET, and the gate stack covers a plurality of semiconductor fins, with the gate stack formed on sidewalls of the plurality of semiconductor fins.

4. The method of claim 1, wherein the horizontal portion of the second hard mask between neighboring ones of the plurality of semiconductor strips is not etched-through when the second anisotropic etch is finished.

5. The method of claim 1, wherein the isolation regions comprise:

first planar bottom surfaces level with a bottom surface of one of the plurality of semiconductor strips; and second planar bottom surfaces lower than the first planar bottom surfaces; and straight edges connecting the first planar bottom surfaces to respective ones of the second planar bottom surfaces.

6. The method of claim 1, wherein after the isolation regions are recessed, top surfaces of remaining portions of the isolation regions are higher than a bottom of one of the plurality of semiconductor strips.

7. The method of claim 1, wherein the first anisotropic etch and the second anisotropic etch are performed using a same etchant gas.

8. The method of claim 1, wherein the first anisotropic etch and the second anisotropic etch are performed using different etchant gases.

9. The method of claim 1, wherein during the first anisotropic etch and the second anisotropic etch, the horizontal portion of the second hard mask is exposed to respective etching gases.

10. A method comprising:
forming a semiconductor strip by etching a semiconductor substrate to form recesses, wherein the recesses are on opposite sides of the semiconductor strip, wherein portions of the semiconductor substrate have a first top surface and a second top surface, each directly underlying one of the recesses:

forming a hard mask layer on sidewalls of the semiconductor strip;

performing a first etch on the hard mask layer to remove some horizontal portions of the hard mask layer, with vertical portions of the hard mask layer remaining;

performing a second etch on the semiconductor substrate using the vertical portions of the hard mask layer as parts of an etching mask to extend the recesses below a bottom end of the vertical portions of the hard mask layer, wherein the first top surface of the semiconductor substrate is recessed and the second top surface of the semiconductor substrate is protected by a horizontal portion of the hard mask layer in the second etch;

removing the vertical portions of the hard mask layer;

forming isolation regions in the recesses;

recessing the isolation regions, wherein a portion of the semiconductor strip between the isolation regions protrudes higher than the isolation regions to form a semiconductor fin; and forming a gate stack on a top surface and sidewalls of the semiconductor fin to form a Fin Field-Effect Transistor (FinFET), wherein the FinFET is a single-Fin FinFET.

11. The method of claim 10, wherein the first etch and the second etch are performed using a same etchant gas.

12. The method of claim 10, wherein the first etch and the second etch are performed using different etchant gases.

13. The method of claim 10, wherein the first etch and the second etch are performed using anisotropic etch.

14. The method of claim 10, wherein after the isolation regions are recessed and the gate stack is formed, top surfaces of remaining portions of the isolation regions are higher than a bottom of the semiconductor strip.

15. The method of claim 10, wherein during the second etch, the horizontal portion of the hard mask layer is exposed to a respective etching gas.

16. A method comprising:
forming a hard mask layer on sidewalls and top surfaces of a plurality of semiconductor strips, wherein the plurality of semiconductor strips protrudes higher than a bulk portion of a semiconductor substrate;

performing a first etching to remove some horizontal portions of the hard mask layer, wherein after the first etching, a horizontal portion of the hard mask layer between two of the plurality of semiconductor strips remains;

performing a second etching to etch the semiconductor substrate and to form a semiconductor base using remaining portions of the hard mask layer as an etching mask;

removing remaining portions of the hard mask layer;

depositing isolation regions between the plurality of semiconductor strips, wherein the isolation regions further comprise portions contacting outer sidewalls of the semiconductor base;

recessing the isolation regions, wherein top portions of the plurality of semiconductor strips protrude higher than the isolation regions to form semiconductor fins; and forming a gate stack on top surfaces and sidewalls of the semiconductor fins to form a Fin Field-Effect Transistor (FinFET).

17. The method of claim 16, wherein during the first etching and the second etching, a continuous region including the plurality of semiconductor strips and regions between the plurality of semiconductor strips is not covered by any etching mask in addition to the hard mask layer.

18. The method of claim 16, wherein different etchants are used to etch the hard mask layer and the bulk portion of the semiconductor substrate.

19. The method of claim 16, wherein after the isolation regions are recessed and the gate stack is formed, top surfaces of remaining portions of the isolation regions are higher than bottom surfaces of the plurality of semiconductor strips.

20. The method of claim 16, wherein during the first etching and the second etching, the horizontal portion of the hard mask layer is exposed to respective etching gases.

* * * * *